(12) United States Patent
Watanabe et al.

(10) Patent No.: US 10,304,882 B1
(45) Date of Patent: May 28, 2019

(54) SOURCE FOLLOWER DEVICE FOR ENHANCED IMAGE SENSOR PERFORMANCE

(71) Applicant: OmniVision Technologies, Inc., Santa Clara, CA (US)

(72) Inventors: Kazufumi Watanabe, Mountain View, CA (US); Young Woo Jung, San Jose, CA (US); Chih-Wei Hsiung, San Jose, CA (US); Dyson Tai, San Jose, CA (US); Lindsay Grant, Los Gatos, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/828,217

(22) Filed: Nov. 30, 2017

(51) Int. Cl.
| | |
|---|---|
| *H01L 21/336* | (2006.01) |
| *H01L 27/146* | (2006.01) |
| *H04N 5/3745* | (2011.01) |
| *H01L 29/10* | (2006.01) |
| *H01L 29/78* | (2006.01) |
| *H01L 29/49* | (2006.01) |

(52) U.S. Cl.
CPC .. *H01L 27/14612* (2013.01); *H01L 27/14689* (2013.01); *H01L 29/1079* (2013.01); *H04N 5/3745* (2013.01); *H01L 29/4916* (2013.01); *H01L 29/7838* (2013.01)

(58) Field of Classification Search
CPC .................................................. H01L 27/14643
See application file for complete search history.

(56) References Cited

U.S. PATENT DOCUMENTS

| | | | |
|---|---|---|---|
| 9,478,571 B1* | 10/2016 | Bakhishev | ........ H01L 27/14616 |
| 2008/0035969 A1* | 2/2008 | Ko | ..................... H01L 27/14601 |
| | | | 257/292 |
| 2017/0141153 A1* | 5/2017 | Lee | ................... H01L 27/14652 |

* cited by examiner

*Primary Examiner* — Thao P Le
(74) *Attorney, Agent, or Firm* — Christensen O'Connor Johnson Kindness PLLC

(57) ABSTRACT

An image sensor includes a photodiode disposed in a semiconductor material to generate image charge in response to incident light, and a floating diffusion disposed in the semiconductor material proximate to the photodiode. A transfer transistor is coupled to the photodiode to transfer the image charge from the photodiode into the floating diffusion in response to a transfer signal applied to a transfer gate of the transfer transistor. A source follower transistor is coupled to the floating diffusion to amplify a charge on the floating diffusion. The source follower transistor includes a gate electrode including a semiconductor material having a first dopant type; a source electrode, having a second dopant type, disposed in the semiconductor material; a drain electrode, having the second dopant type, disposed in the semiconductor material; and a channel, having the second dopant type, disposed between the source electrode and the drain electrode.

16 Claims, 5 Drawing Sheets

US 10,304,882 B1

SOURCE FOLLOWER DEVICE FOR ENHANCED IMAGE SENSOR PERFORMANCE

TECHNICAL FIELD

This disclosure relates generally to semiconductor fabrication, and in particular but not exclusively, relates to CMOS image sensors.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

Image sensors may suffer from noise that may originate in circuitry in the image sensor. Image noise may affect the quality of the image output from the image sensor. For example, image noise may produce white pixels, off-color pixels, and the like.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
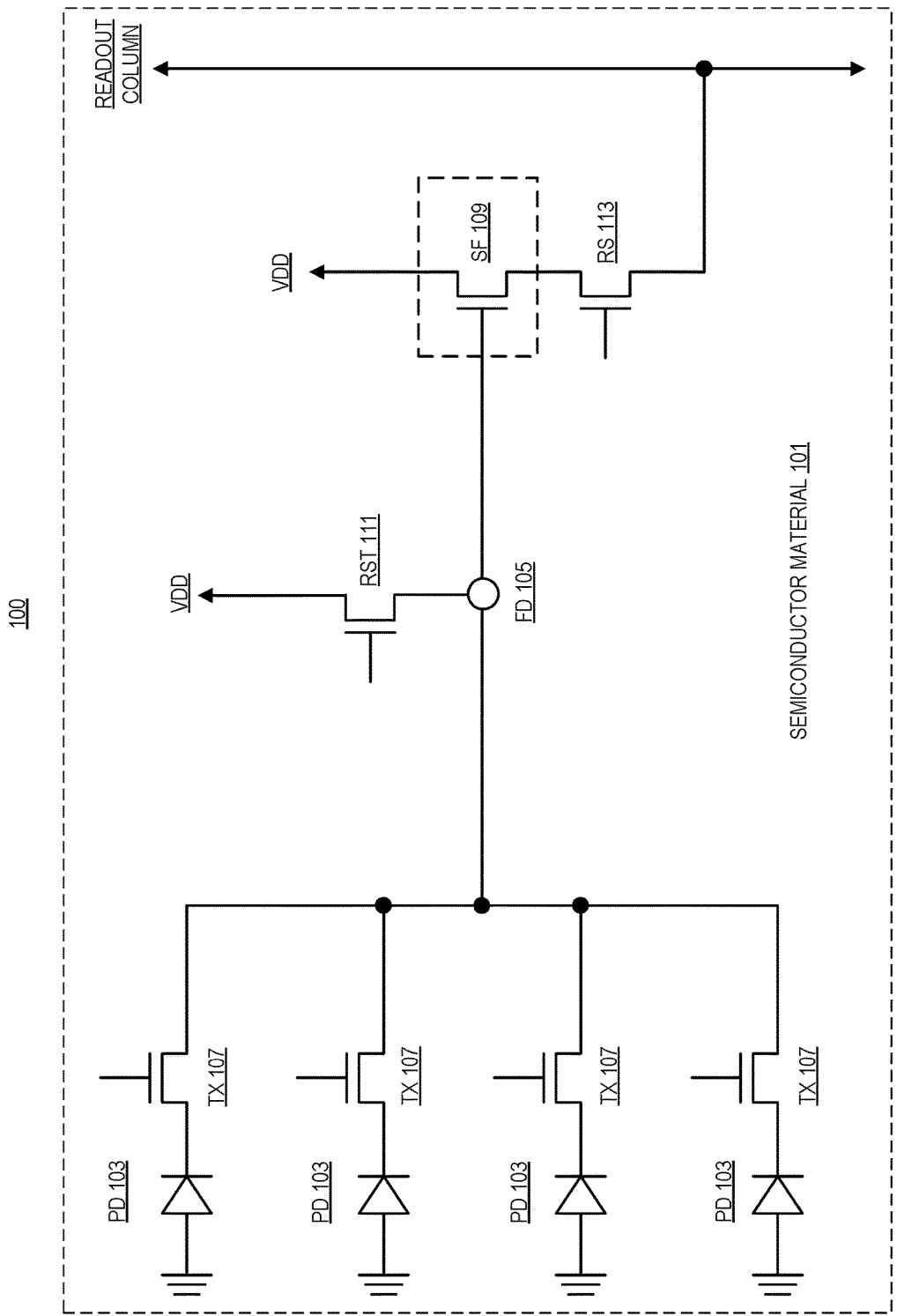
FIG. 1 depicts an example four-transistor (4T) pixel architecture, in accordance with the teaching of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method relating to a source follower device for enhanced image sensor performance are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Examples and embodiments of the present disclosure relate to reducing random telegraph signal (RTS) noise, also known as burst noise, in image sensor pixel circuits. More specifically, to achieve this goal, modifications to the source follower transistor are shown in accordance with the teachings of the present disclosure. RTS noise may stem from charge traps (e.g., dangling bonds, OH— groups, etc., which trap electrons or holes flowing through the channel of the device) at the interface of the semiconductor material and gate oxide. By adding a doped layer (e.g., p-type) under the channel of the source follower transistor and back biasing the device, channel well widening is accelerated, and the interaction between traps at the interface and charge carriers in the channel is reduced. This results in less signal noise output from the source follower device.

FIG. 1 depicts an example four-transistor (4T) pixel architecture 100 for use in an image sensor, in accordance with the teachings of the present disclosure. As shown, most of the devices depicted are formed in (or partially in) semiconductor material 101. 4T pixel architecture 100 includes photodiodes 103, transfer transistors 107, floating diffusion 105, reset transistor 111, source follower transistor 109, and row select transistor 113. It is appreciated that for a true 4T pixel architecture, only one photodiode 103 and one transfer transistor 107 are needed; however, depicted here is a four-photodiode 103 variant.

In the depicted example, a plurality of photodiodes 103 is disposed in semiconductor material 101 (e.g., silicon) to generate image charge in response to incident light, and floating diffusion 105 is also disposed in semiconductor material 101 proximate to photodiodes 103. Transfer transistors 107 are coupled to photodiodes 103 to transfer the image charge from photodiodes 103 into floating diffusion 105 in response to a transfer signal applied to transfer gates of transfer transistors 107. Transfer transistors 107 may be turned on in sequence to transfer charge from photodiodes 103 to floating diffusion 105 one at a time. The gate electrode of source follower transistor 109 is coupled to floating diffusion 105 to amplify a charge on floating diffusion 105. Reset transistor 111 is coupled to floating diffusion 105 to reset image charge in floating diffusion 105 (in response to a reset signal applied to the gate electrode), and row select transistor 113 is coupled to source follower transistor 109 to output the image signal.

In the depicted example, there are four photodiodes 103 and four transfer transistors 107. However, in other examples there may be any number of photodiodes 103 and transfer transistors 107 per floating diffusion 105 including, one, two, three, five, or six. Moreover, one of ordinary skill in the art having the benefit of the present disclosure will appreciate that 4T pixel architecture 100 depicted here may be repeated any number of times to form an image sensor.

FIGS. 2A-2D depict example source follower devices 209A-209D, which may be included in the 4T pixel architecture depicted in FIG. 1, in accordance with the teachings of the present disclosure. One of ordinary skill in the art having the benefit of the present disclosure will realize that aspects of the source follower transistors depicted in FIGS. 2A-2D may be combined or removed, in accordance with the teachings of the present disclosure. Moreover, dopant types/polarities (e.g., P or N type) may be reversed.

Figure 2A:
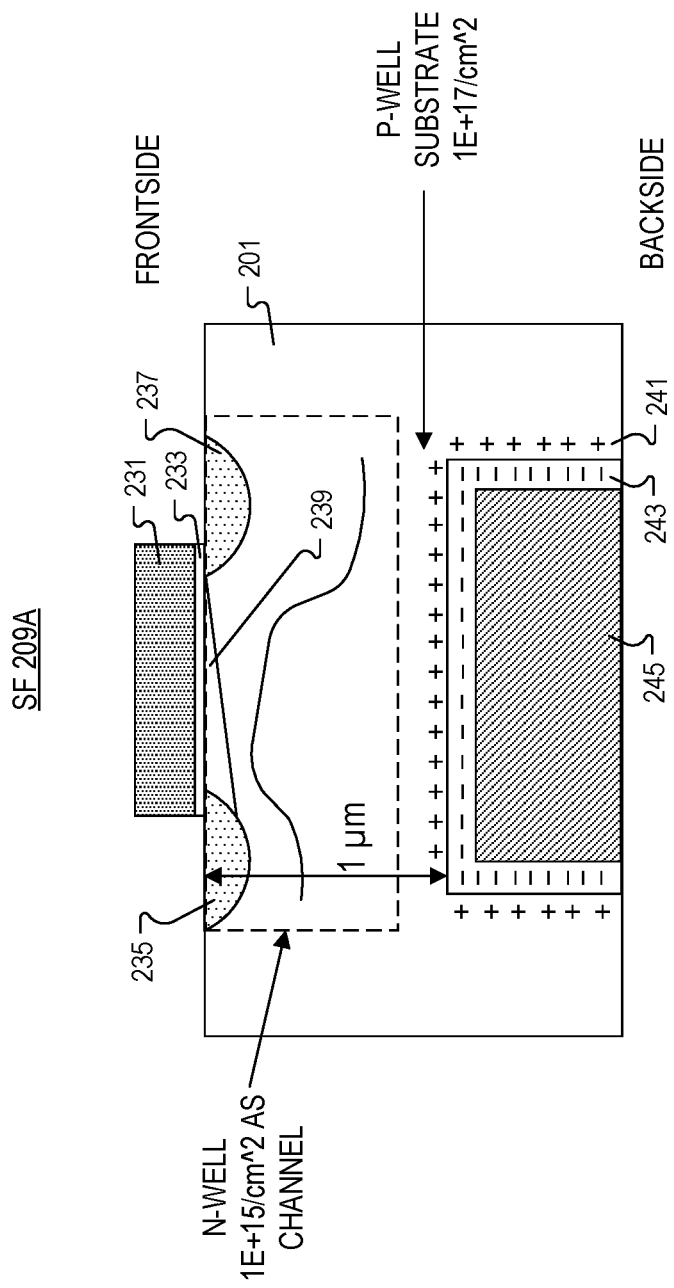
FIGS. 2A-2D depict example source follower devices which may be included in the 4T pixel architecture depicted in FIG. 1, in accordance with the teachings of the present disclosure.

FIG. 2A illustrates source follower transistor 209A including semiconductor material 201, gate electrode 231, gate oxide 233, source electrode 235, drain electrode 237, channel 239, charged layer 241, charged oxide 243, and fill material 245.

As illustrated, gate electrode 231 includes a semiconductor material (e.g., polycrystalline silicon, with gate oxide 233 disposed between the polycrystalline silicon and semiconductor material 201) having a first dopant type (e.g., p-type). Gate electrode 231 is disposed above semiconductor material 201. Gate oxide 233 may include silicon oxide, hafnium oxide, or the like. Source electrode 235 has a second dopant type (e.g., n-type), and is disposed in semiconductor material 201. Drain electrode 237 also has the second dopant type, and is disposed in semiconductor material 201. Channel 239 has the second dopant type and is disposed between source electrode 235 and drain electrode 237. In the depicted example, source electrode 235 and drain electrode 237 have a higher dopant concentration than channel 239.

Also shown is charged layer 241, having the first dopant type (e.g., p-type), disposed in semiconductor material 201 proximate to channel 239. Deep trench isolation structure (including charged oxide 243 and filler material 245) is disposed in semiconductor material 201; charged layer 241 accumulates in semiconductor material 201 proximate to an interface of charged oxide 243 and semiconductor material 201. The interface of charged oxide 243 and semiconductor material 201, and the frontside surface of semiconductor material 201 may be separated by 1 μm. Charged layer 241 accumulates in response to the charged oxide 243. In the depicted example, charged oxide 243 may be hafnium oxide, aluminum oxide, or the like. Fill material may include silicon oxide, polymer, doped semiconductor material, or the like. As shown, deep trench isolation structure is vertically aligned (e.g., between the frontside and the backside of semiconductor material 201) with source follower transistor 209 in the semiconductor material 201.

In the illustrated example, when a positive voltage is applied to gate electrode 231, electrons accumulate in channel 239, and source follower transistor 209 is on. N-type channel 239 is pulled down into semiconductor material 201 by the p-type pinning layer (e.g., charged layer 241) so as to reduce the interaction between the $SiO_2$/Si interface (e.g., gate oxide 233/semiconductor 201 interface disposed on the front side of the device) and n-type channel 239. Thus, RTS noise from the source follower transistor 209 is reduced. When there is no bias applied to gate electrode 231, channel 239 is a high-resistance n-type well, thus source electrode 235 and drain electrode 237 are not connected, and source follower transistor 209 is off.

Figure 2B:
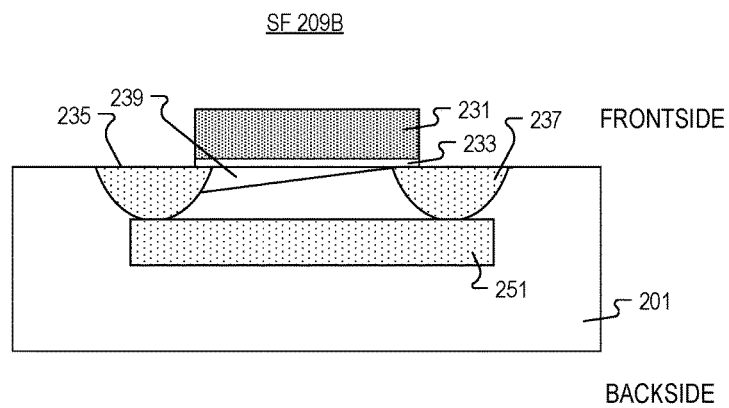

FIG. 2B shows an example source follower transistor 209B, which includes many of the same features as source follower transistor 209A, but the charged layer includes a first layer of dopant 251 in semiconductor material 201, and first layer of dopant 251 is substantially parallel to channel 239. It is appreciated, that first layer of dopant 251 is in contact with source electrode 235 and drain electrode 237. However, in other examples, semiconductor material 201, or other layers of device architecture, may separate first layer of dopant 251 from source electrode 235 and drain electrode 237.

In the depicted example, the operation mode is similar to an n-MOSFET, but the MOSFET structure concept is different. For example, first layer of dopant 251 (e.g., a P+ region) works like a dual gate, channel 239 is not an inversion layer (it's an accumulation layer), and gate electrode 231 may be P+ poly crystalline silicon (i.e., polysilicon, poly Si, or the like). Thus, channel 239 is fully depleted, so off-current leakage is small. Moreover, the depicted example is not a silicon-on-insulator structure.

Figure 2C:
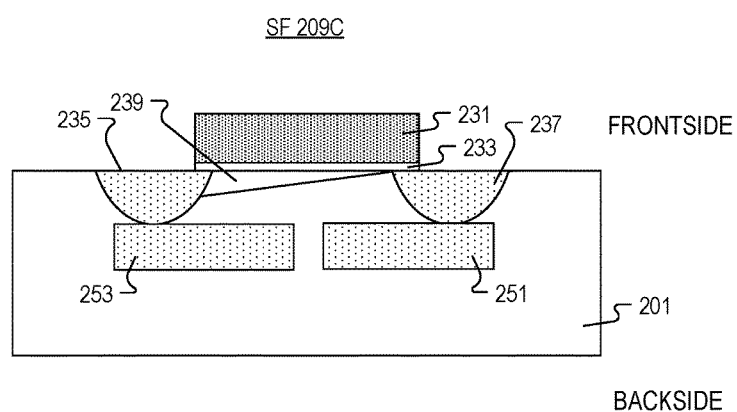

FIG. 2C depicts an example source follower transistor 209C which includes many of the features of source follower transistor 209B, but also includes second layer of dopant 253. As depicted, charged layer includes second layer of dopant 253 in-plane (e.g., parallel and in the same vertical plane of device architecture) with first layer of dopant 251. Also, first layer of dopant 251 and second layer of dopant 253 are laterally separated by a portion of semiconductor material 201.

Figure 2D:
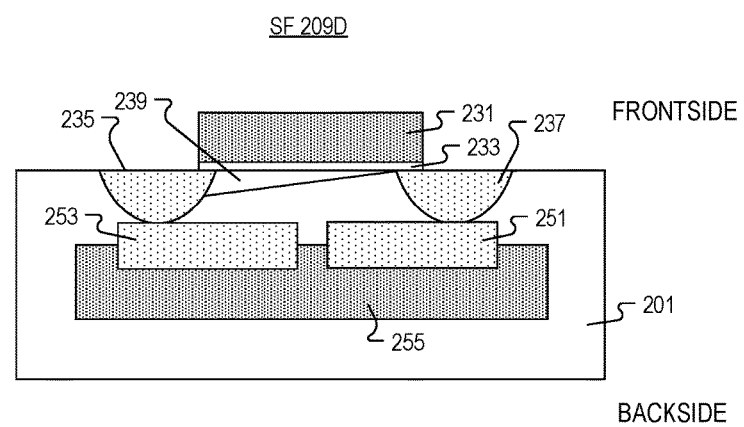

FIG. 2D illustrates an example source follower transistor 209D, which includes many of the features of source follower transistor 209C, but also includes third layer of dopant 255. As illustrated, third layer of dopant 255 is disposed, at least in part, between first layer of dopant 251 and second layer of dopant 253. In other words, third layer of dopant 255 spans the gap between first layer of dopant 251 and second layer of dopant 253. As depicted, third layer of dopant 255 has a larger lateral dimension than both first layer of dopant 251 and second layer of dopant 253 combined. However, in other examples, third layer of dopant 255 may be laterally coextensive with first layer of dopant 251 and second layer of dopant 253. In some examples, third layer of dopant 255 may be laterally larger than channel 239, source electrode 235, and drain electrode 237 combined. Third layer of dopant 255 may also have a greater concentration of dopant, or a lower concentration of dopant, than first layer of dopant 251 and second layer of dopant 253.

Figure 3:
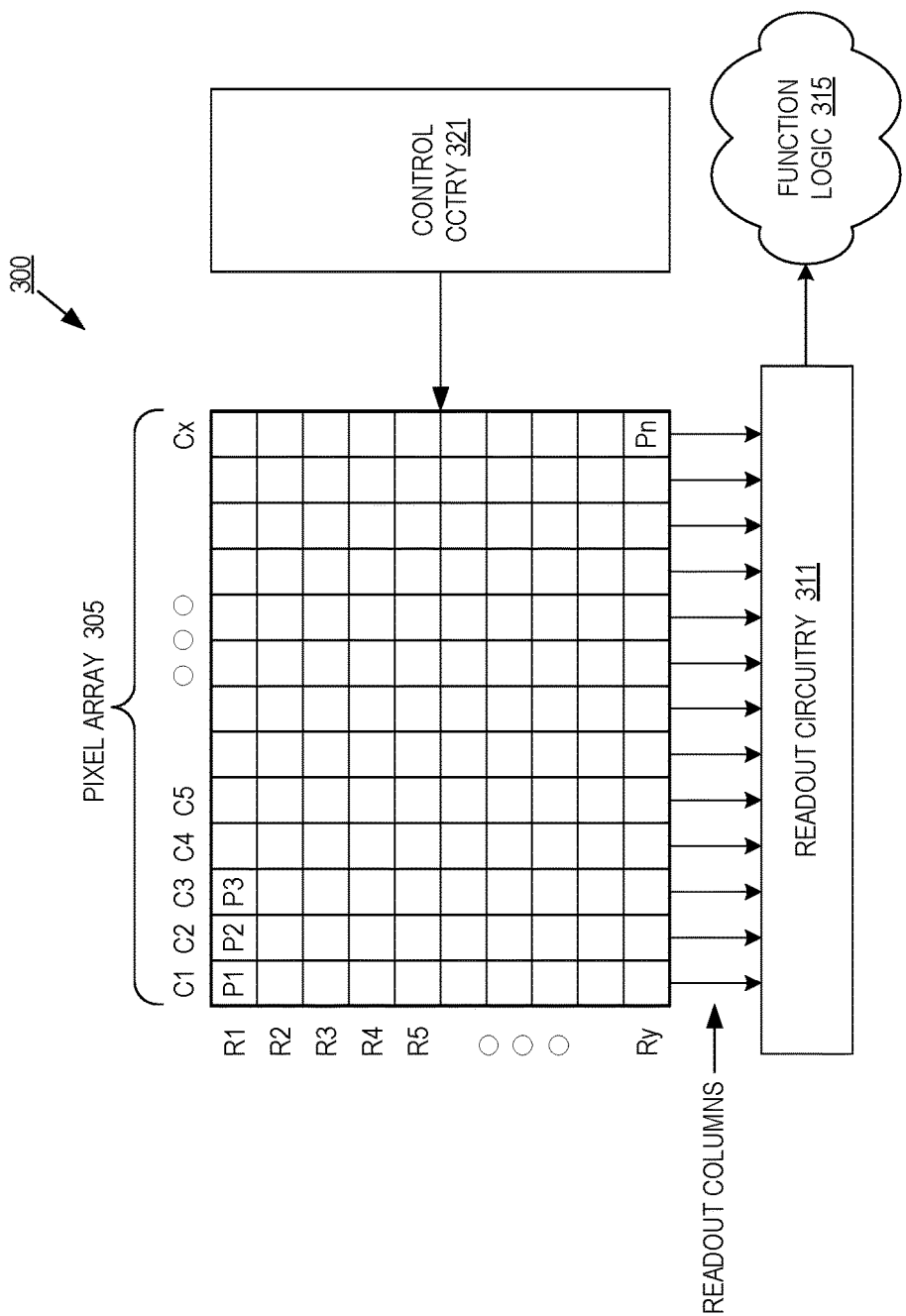
FIG. 3 illustrates a block diagram of one example of an imaging system which may include aspects of FIGS. 2A-2D, in accordance with the teachings of the present disclosure.

FIG. 3 illustrates a block diagram of one example of an imaging system 300 which may include aspects of FIGS. 2A-2D, in accordance with the teachings of the present disclosure. Imaging system 300 includes pixel array 305, control circuitry 321, readout circuitry 311, and function logic 315. In one example, pixel array 305 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 305 has acquired its image data or image charge, the image data is readout by readout circuitry 311 and then transferred to function logic 315. In various examples, readout circuitry 311 may include amplification circuitry, analog-to-digital (ADC) conversion circuitry, or otherwise. Function logic 315 may simply store the image data or even manipulate the image data by applying post image effects (e.g., autofocus, crop, rotate, remove red eye, adjust brightness, adjust contrast, or otherwise). In one example, readout circuitry 311 may readout a row of image data at a time along readout column lines (illustrated) or may readout the image data using a variety of other techniques (not illustrated), such as a serial readout or a full parallel readout of all pixels simultaneously.

In one example, control circuitry 321 is coupled to pixel array 305 to control operation of the plurality of photodiodes in pixel array 305. For example, control circuitry 321 may generate a shutter signal for controlling image acquisition. In the depicted example, the shutter signal is a global shutter signal for simultaneously enabling all pixels within pixel array 305 to simultaneously capture their respective image data during a single acquisition window. In another example, image acquisition is synchronized with lighting effects such as a flash.

In one example, imaging system 300 may be included in a digital camera, cell phone, laptop computer, automobile or the like. Additionally, imaging system 300 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 300, extract image data from imaging system 300, or manipulate image data supplied by imaging system 300.

Figure 4:
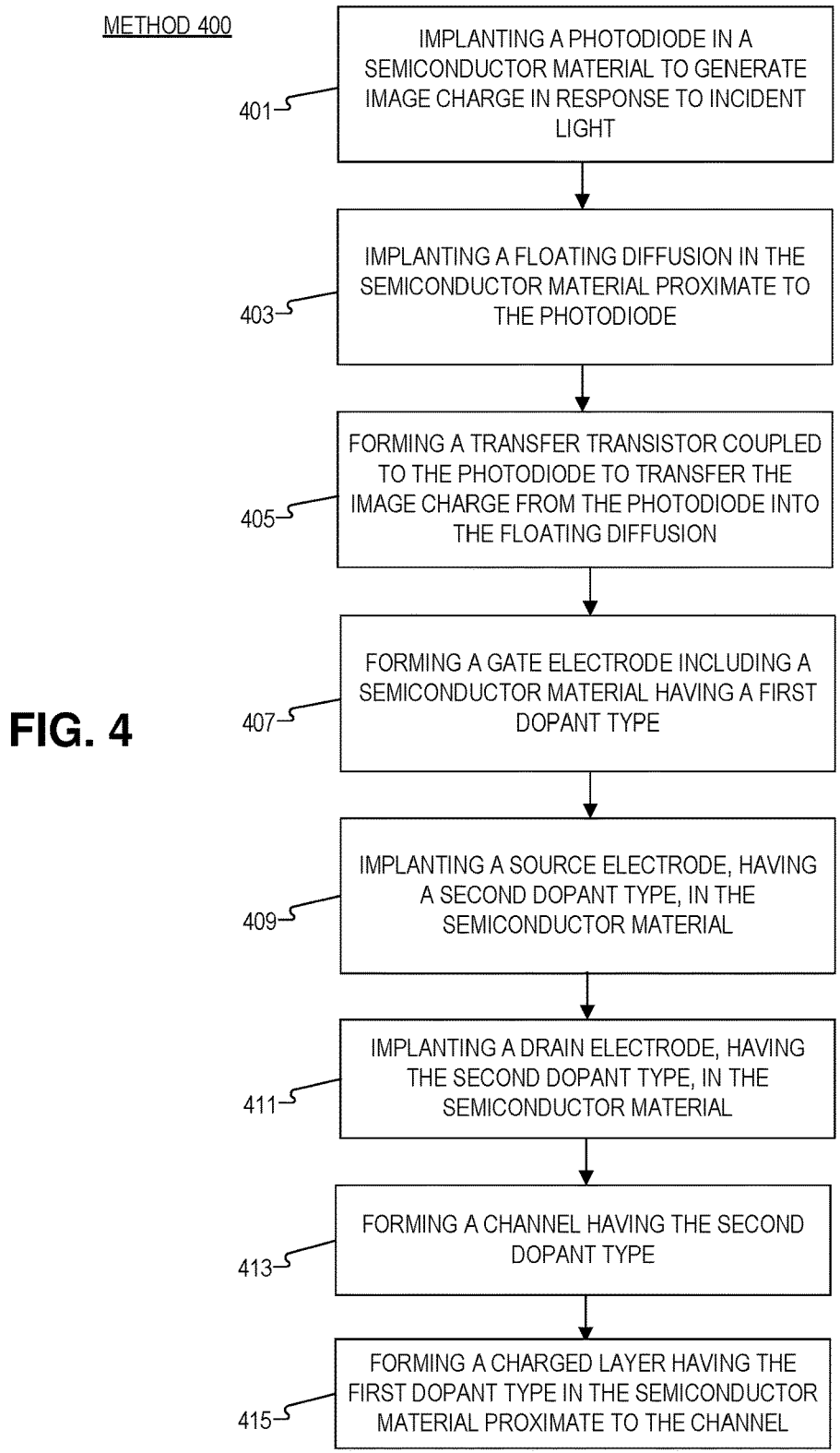
FIG. 4 illustrates one example of a method for fabricating an image sensor, in accordance with the teachings of the present disclosure.

FIG. 4 illustrates one example of a method 400 of fabricating an image sensor, in accordance with the teachings of the present disclosure. One of ordinary skill in the art will appreciate that the blocks depicted in FIG. 4 may occur in any order and even in parallel. Moreover blocks may be added to, or removed from, FIG. 4 in accordance with the teachings of the present disclosure.

Block 401 shows implanting a photodiode in a semiconductor material to generate image charge in response to incident light. Implantation may be achieved using ion implantation of dopant elements such as boron, phosphorus, arsenic, or the like.

Block 403 illustrates implanting a floating diffusion in the semiconductor material proximate to the photodiode. The floating diffusion may also be implanted using ion implantation or other methods.

Block 405 depicts forming a transfer transistor (also referred to as a "transfer gate") coupled to the photodiode to transfer the image charge from the photodiode into the floating diffusion. Portions of the photodiode and floating diffusion may function as a source and drain, respectively. Then a gate oxide and gate electrode may be formed over the channel and laterally positioned between the source and drain electrodes.

Blocks 407-413 show forming a source follower transistor coupled to the floating diffusion. As stated above, the source follower transistor that is formed may reduce RTS noise in the signal output from the pixels in the image sensor.

Block 407 shows forming a gate electrode of the source follower transistor including a semiconductor material having a first dopant type. The gate electrode may be formed from polycrystalline silicon that is p-doped. The polycrystalline silicon may be deposited at the same time as forming the gate electrode for the transfer transistor (and other transistors). Then a photoresist may be applied over the polycrystalline silicon, portions of the photoresist may be removed to define the gate electrode features, and then the shape of the gate electrode may be etched from the polycrystalline silicon.

Block 409 illustrates implanting a source electrode, having a second dopant type, in the semiconductor material. As described above, this may include implanting dopant such as phosphorus or arsenic (n-type dopants) in the semiconductor material.

Block 411 depicts implanting a drain electrode, having the second dopant type, in the semiconductor material. Similarly, this may include implanting dopant such as phosphorus or arsenic in the semiconductor material.

Block 413 shows forming a channel, having the second dopant type, between the source electrode and the drain electrode. Similar to the source and drain electrode, forming the channel may be achieved by ion implanting phosphorus or arsenic into the semiconductor material. The channel may also be formed by growing the semiconductor material in the presence of dopants, or by diffusing dopant into the semiconductor material. In some examples, the source electrode and the drain electrode have a higher dopant concentration than the channel (e.g., the channel has a dopant atom concentration that is one or more orders of magnitude less than that of the source and drain electrodes).

Block 415 depicts forming a charged layer having the first dopant type in the semiconductor material proximate to the channel. In one example, this may be achieved by forming a deep trench isolation structure in the semiconductor material. Forming a deep trench may include etching a trench in the semiconductor material proximate to the channel, and depositing a charged oxide in the trench, where the charged layer accumulates in the semiconductor material proximate to an interface of the charged oxide and the semiconductor material. In other words, the charged oxide may have a net negative charge, and in response to the net negative charge, positive charge accumulates in the semiconductor material at the interface of the charged oxide and the semiconductor material.

In other examples, forming the charged layer includes implanting a first layer of dopant (e.g., p-type) in the semiconductor material, and the first layer of dopant is substantially parallel to the channel. In another or a different example, the charged layer includes implanting a second layer of dopant in plane with the first layer of dopant (thus both first and second dopant layers may be substantially parallel to the channel). In one example, first layer of dopant and the second layer of dopant are separated by a portion of the semiconductor material. In some examples, a third layer of dopant may be implanted that is laterally coextensive with the first layer of dopant and the second layer of dopant. The third layer of dopant may be disposed between the first layer of dopant and the second layer of dopant.

In some examples, a reset transistor may also be formed, and the reset transistor may be coupled to the floating diffusion to reset image charge in the floating diffusion in response to a reset signal applied to the gate terminal of the reset transistor. Similarly a row select transistor may also be formed coupled to a terminal of the source follower transistor to output the image signal.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
a photodiode disposed in a semiconductor material to generate image charge in response to incident light;
a floating diffusion disposed in the semiconductor material proximate to the photodiode;
a transfer transistor coupled to the photodiode to transfer the image charge from the photodiode into the floating diffusion in response to a transfer signal applied to a transfer gate of the transfer transistor; and
a source follower transistor coupled to the floating diffusion to amplify a charge on the floating diffusion, the source follower transistor, including:
a gate electrode including a semiconductor material having a first dopant type;
a source electrode, having a second dopant type, disposed in the semiconductor material;
a drain electrode, having the second dopant type, disposed in the semiconductor material;
a channel, having the second dopant type, disposed between the source electrode and the drain electrode, wherein the source electrode and the drain electrode have a higher dopant concentration than the channel;
a charged layer having the first dopant type disposed in the semiconductor material, wherein the channel is disposed between the charged layer and the gate electrode, and
a deep trench isolation structure disposed in the semiconductor material and including a charged oxide, and wherein the charged layer accumulates in the semiconductor material proximate to an interface of the charged oxide and the semiconductor material.

2. The image sensor of claim 1, wherein the first dopant type is p-type and the second dopant type is n-type.

3. The image sensor of claim 1, wherein the charged layer accumulates in response to the charged oxide having a negative charge.

4. An image sensor, comprising:
a photodiode disposed in a semiconductor material to generate image charge in response to incident light;
a floating diffusion disposed in the semiconductor material proximate to the photodiode;
a transfer transistor coupled to the photodiode to transfer the image charge from the photodiode into the floating diffusion in response to a transfer signal applied to a transfer gate of the transfer transistor; and
a source follower transistor coupled to the floating diffusion to amplify a charge on the floating diffusion, the source follower transistor, including:
a gate electrode including a semiconductor material having a first dopant type;
a source electrode, having a second dopant type, disposed in the semiconductor material;
a drain electrode, having the second dopant type, disposed in the semiconductor material;
a channel, having the second dopant type, disposed between the source electrode and the drain electrode, wherein the source electrode and the drain electrode have a higher dopant concentration than the channel; and
a charged layer having the first dopant type disposed in the semiconductor material, wherein the channel is disposed between the charged layer and the gate electrode; wherein the charged layer includes a first layer of dopant and a second layer of dopant in-plane with the first layer of dopant, wherein the first layer of dopant and the second layer of dopant are separated by a portion of the semiconductor material.

5. The image sensor of claim 4, wherein the charged layer includes a third layer of dopant that is laterally larger than the first layer of dopant and the second layer of dopant, and is disposed between the first layer of dopant and the second layer of dopant.

6. The image sensor of claim 1, wherein gate electrode includes polycrystalline silicon with an oxide layer disposed between the polysilicon and the semiconductor material.

7. The image sensor of claim 1, further comprising:
a reset transistor coupled to the floating diffusion to reset image charge in the floating diffusion; and
a row select transistor coupled to the source follower transistor.

8. A method of fabricating an image sensor, comprising:
implanting a photodiode in a semiconductor material to generate image charge in response to incident light;
implanting a floating diffusion in the semiconductor material proximate to the photodiode;
forming a transfer transistor coupled to the photodiode to transfer the image charge from the photodiode into the floating diffusion; and
forming a source follower transistor coupled to the floating diffusion, including:
forming a gate electrode including a semiconductor material having a first dopant type;
implanting a source electrode, having a second dopant type, in the semiconductor material;
implanting a drain electrode, having the second dopant type, in the semiconductor material;
forming a channel, having the second dopant type, between the source electrode and the drain electrode, wherein the source electrode and the drain electrode have a higher dopant concentration than the channel; and
forming a charged layer having the first dopant type in the semiconductor material proximate to the channel wherein the channel is disposed between the charged layer and the gate electrode, wherein forming the charged layer includes implanting a first layer of dopant in the semiconductor material that is substantially parallel to the channel, and implanting a second layer of dopant in-plane with the first layer of dopant, wherein the first layer of dopant and the second layer of dopant are separated by a portion of the semiconductor material.

9. The method of claim 8, wherein the first dopant type is p-type and the second dopant type is n-type.

10. The method of claim 8, wherein forming the charged layer includes implanting a third layer of dopant that is laterally larger than the first layer of dopant and the second layer of dopant, and is disposed between the first layer of dopant and the second layer of dopant.

11. The method of claim 8, wherein gate electrode includes polycrystalline silicon with an oxide layer disposed between the polysilicon and the semiconductor material.

12. The method of claim 8, further comprising:
forming a reset transistor coupled to the floating diffusion to reset image charge in the floating diffusion; and
forming a row select transistor coupled to the source follower transistor.

13. The image sensor of claim 1, wherein the charged oxide includes at least one of hafnium oxide or aluminum oxide.

14. The image sensor of claim 13, wherein the deep trench isolation structure includes a filler material, wherein the charged oxide is disposed between the semiconductor material and the filler material.

15. The image sensor of claim 14, wherein the filler material includes at least one of silicon oxide, a polymer, or a second semiconductor material.

16. The image sensor of claim 1, wherein an interface between the charged oxide and the semiconductor material is separated from the frontside of the semiconductor material by 1 μm.

\* \* \* \* \*